United States Patent
Shi et al.

(10) Patent No.: US 12,092,962 B1
(45) Date of Patent: Sep. 17, 2024

(54) MEASUREMENTS OF STRUCTURES IN PRESENCE OF SIGNAL CONTAMINATIONS

(71) Applicant: Onto Innovation Inc., Wilmington, MA (US)

(72) Inventors: Jingsheng Shi, Singapore (SG); Yiliang Liu, Singapore (SG); Jie Li, San Jose, CA (US); Pedro Vagos, Chennevieres (FR)

(73) Assignee: Onto Innovation Inc., Wilmington, MA (US)

( * ) Notice: Subject to any disclaimer, the term of this patent is extended or adjusted under 35 U.S.C. 154(b) by 0 days.

(21) Appl. No.: 18/495,247

(22) Filed: Oct. 26, 2023

(51) Int. Cl.
  *G03F 7/00* (2006.01)
  *G01N 21/95* (2006.01)
  *H01L 21/66* (2006.01)

(52) U.S. Cl.
  CPC ......... *G03F 7/705* (2013.01); *G01N 21/9501* (2013.01); *G03F 7/70625* (2013.01); *H01L 22/12* (2013.01)

(58) Field of Classification Search
  CPC . G03F 7/705; G03F 7/70625; G01N 21/9501; H01L 22/12
  USPC .............................................................. 430/3
  See application file for complete search history.

(56) References Cited

U.S. PATENT DOCUMENTS

| | | | |
|---|---|---|---|
| 4,656,358 A | 4/1987 | Divens et al. | |
| 5,455,673 A | 10/1995 | Alsmeyer et al. | |
| 5,760,901 A | 6/1998 | Hill | |
| 6,489,611 B1 | 12/2002 | Aumond et al. | |
| 6,661,004 B2 | 12/2003 | Aumond et al. | |
| 7,145,654 B2 | 12/2006 | Norton | |
| 7,522,272 B2 | 4/2009 | Wolf | |
| 8,259,297 B1 | 9/2012 | Yarussi | |
| 8,614,790 B2 | 12/2013 | Berlatzky et al. | |
| 9,881,821 B2 | 1/2018 | Hung et al. | |
| 9,958,327 B2 | 5/2018 | Shachaf et al. | |

(Continued)

FOREIGN PATENT DOCUMENTS

EP       1947604 A1    7/2008

OTHER PUBLICATIONS

Jiang, W-L et al. (Nov. 1993). "A Novel Technique for Deconvoluting Spectra," Science in China (Series A) 36 (11):1329-1339.

(Continued)

*Primary Examiner* — Caleen O Sullivan
(74) *Attorney, Agent, or Firm* — Paradice & Li LLP

(57) ABSTRACT

Contamination of metrology data by non-target signals caused by the measurement spot being incident on target and non-target areas may be reduced or eliminated using local gradient based mixed modeling or a machine learning model. The local gradient based mixed modeling approach uses a mixed model based on a model of the target region and a term of the local gradient of measured signals, which may be determined from scan data. The machine learning approach obtains mixed metrology data from a plurality of locations with respect to the target. The mixed metrology data is a mixture of target signals from the target and non-target signals from a non-target area and is used by a trained machine learning model to determine target metrology data that includes target signals from the target without the non-target signals and is used to determine parameters of interest for the target.

29 Claims, 8 Drawing Sheets

(56) References Cited

U.S. PATENT DOCUMENTS

| | | | |
|---|---|---|---|
| 10,274,367 | B2 | 4/2019 | Shachaf et al. |
| 10,386,233 | B2 | 8/2019 | Neil |
| 10,754,260 | B2 | 8/2020 | Demirer et al. |
| 2004/0090874 | A1 | 5/2004 | Balasubramanian et al. |
| 2006/0043291 | A1 | 3/2006 | Peng |
| 2008/0024781 | A1 | 1/2008 | Zangooie et al. |
| 2010/0153323 | A1 | 6/2010 | Hennessy et al. |
| 2013/0321908 | A1 | 12/2013 | Babacan et al. |
| 2016/0341670 | A1* | 11/2016 | Vagos ................ G01N 21/8851 |
| 2018/0348055 | A1* | 12/2018 | Shachaf .............. G03F 7/70625 |

OTHER PUBLICATIONS

International Search Report and Written Opinion mailed Dec. 7, 2015 from PCT/US2015/051774 , filed Sep. 23, 2015.
International Preliminary Report on Patentability mailed Apr. 13, 2017 from PCT/US2015/051774 , filed Sep. 23, 2015.
Bargigia, Ilaria et al., "Identifying Incoherent Mixing Effects in the Coherent Two-Dimensional Photocurrent Excitation Spectra of Semiconductors," arXiv:2208.08673v1 [cond-mat.mtrl-sci] Aug. 18, 2022, 26 pages.

* cited by examiner

MEASUREMENTS OF STRUCTURES IN PRESENCE OF SIGNAL CONTAMINATIONS

FIELD OF THE DISCLOSURE

The subject matter described herein is related generally to metrology, and more particularly to measurement of structures with a measurement spot size of a metrology device larger than the target area.

BACKGROUND

Semiconductor and other similar industries often use optical metrology equipment to provide non-contact evaluation of substrates during processing. Optical metrology techniques, such as ellipsometry and reflectometry, typically operate by illuminating a sample with a probe beam of electromagnetic radiation and then detecting and analyzing the reflected and/or transmitted energy. The probe beam may be polarized or unpolarized radiation and may include one or more wavelengths of radiation. Ellipsometry typically measures changes in the polarization state of the reflected beam after interacting with the sample, while reflectometry measures changes in the magnitude of the intensity of the reflected beam.

With optical metrology, for example, it is desirable for the measurement spot produced by an optical metrology device to be incident completely within a target area of the sample under test in order to improve accuracy and precision of the measurement. If the size of the measurement spot is greater than the size of the target area, the resulting optical signal will be contaminated by signals from regions outside the target area, which may make it difficult to accurately measure the desired structure. The size of the measurement spot is conventionally determined by the optical system of the optical metrology device, but redesign of the optical system to reduce the measurement spot size is an expensive and time-consuming task and ultimately may be inadequate to accurately measure increasingly small geometries. Accordingly, techniques other than optical system redesign to compensate for signal contamination are desirable.

SUMMARY

A measurement spot that is larger than the target region or that is mis-aligned with the target area may obtain metrology data from the target area and non-target area, causing the resulting metrology data to be contaminated with signals from non-target areas. The contamination of metrology data by signals from non-target areas may be reduced or eliminated using a local gradient based mixed model or a machine learning model. The local gradient based mixed model includes a model of the target area and a term for the local gradient of measured signals, which may be determined from scan data. Metrology data from the target may be fit to the local gradient based mixed model by fitting parameters in the model of the target area and fitting at least one coefficient for the local gradient. In another approach, a machine learning model is trained based on variations in patterns of metrology data obtained from different locations of a reference target. During measurement, a target mixed metrology data, which is a mixture of target signals from the target and non-target signals from a non-target area, is obtained from a plurality of different locations with respect to the target and is provided as input data for the trained machine learning model. The machine learning model determines target metrology data, which includes target signals without non-target signals, based on the input data. The target metrology data may then be used to determine parameters of interest for the target region, e.g., by fitting the target metrology data to modeled data for the target.

In one implementation, a method for measuring parameters of interest for a target on a sample includes obtaining metrology data for the target with a metrology device, the metrology data is a mixture of target signals from the target and non-target signals from a non-target area. The metrology data is fit to a mixed model containing a model for the target and a local gradient of measured signals. The parameters of interest are determined for the target based on the fit of the metrology data by the mixed model.

In one implementation, a metrology device configured for measuring parameters of interest for a target on a sample includes a source configured to generate radiation to be incident on the device on the sample, at least one detector configured to detect radiation from the device produced in response to the radiation that is incident on the device, and at least one processor coupled to the at least one detector. The at least one processor is configured to obtain metrology data for the target with a metrology device. The metrology data is a mixture of target signals from the target and non-target signals from a non-target area. The at least one processor is further configured to fit the metrology data to a mixed model containing a model for the target and a local gradient of measured signals. The at least one processor is further configured to determine the parameters of interest for the target based on the fit of the metrology data by the mixed mode.

In one implementation, a method for measuring parameters of interest for a target on a sample includes obtaining mixed metrology data with a metrology device at a plurality of different locations with respect to the target, where the mixed metrology data from each different location is a mixture of target signals from the target and non-target signals from a non-target area. The method further includes determining target metrology data using a trained machine learning model based on the mixed metrology data for the target, where the target metrology data includes the target signals from the target without the non-target signals from the non-target area, and determining the parameters of interest for the target based on the target metrology data.

In one implementation, a metrology device configured for measuring parameters of interest for a target on a sample includes a source configured to generate radiation to be incident on the device on the sample, at least one detector configured to detect radiation from the device produced in response to the radiation that is incident on the device, and at least one processor coupled to the at least one detector. The at least one processor is configured to obtain mixed metrology data with a metrology device at a plurality of different locations with respect to the target, where the mixed metrology data from each different location is a mixture of target signals from the target and non-target signals from a non-target area. The at least one processor is further configured to determine target metrology data using a trained machine learning model based on the mixed metrology data, where the target metrology data includes the target signals from the target without the non-target signals from the non-target area, and determine the parameters of interest for the target based on the target metrology data for the target.

DETAILED DESCRIPTION

Figure 1:
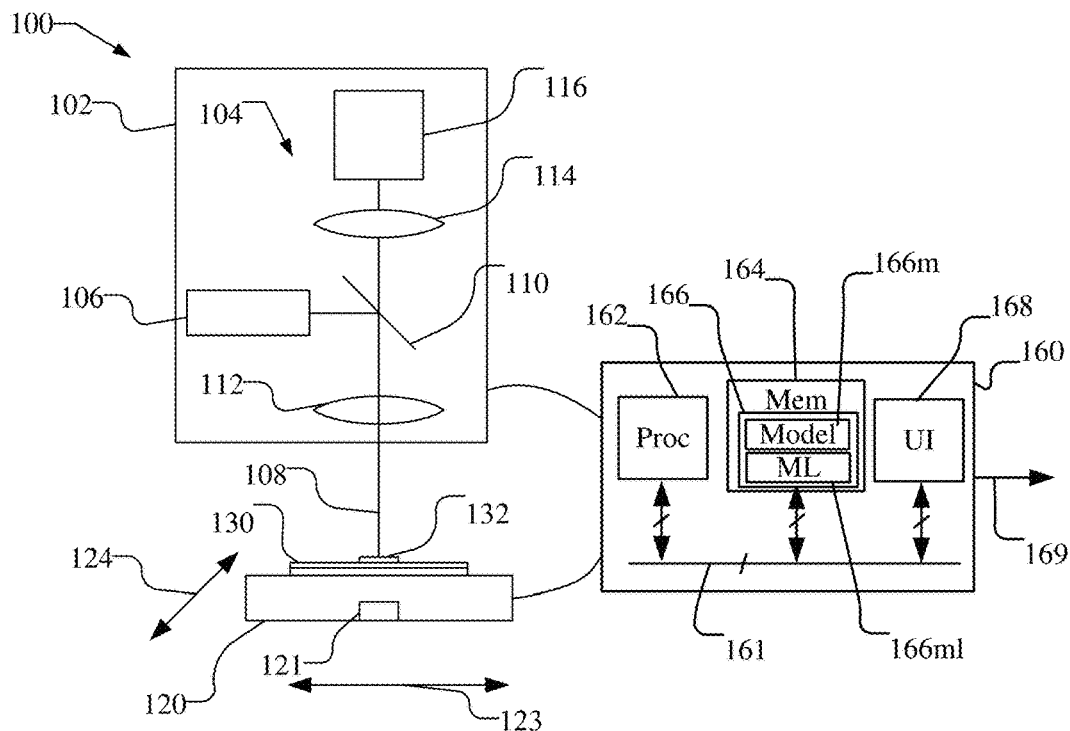
FIG. 1 shows a schematic view of a metrology device configured to reduce or eliminate the contamination of the signal from non-target regions.

During fabrication of semiconductor and similar devices it is often necessary to monitor the fabrication process by non-destructively measuring the devices. One type of metrology that may be used for non-destructive measurement of samples during processing is optical metrology, which may use radiation at normal or oblique incidence and may use a single wavelength or multiple wavelengths. Examples of optical metrology may include ellipsometry, reflectometry, Fourier Transform infrared spectroscopy (FTIR), etc. Other types of metrology may also be used, including X-ray metrology, opto-acoustic metrology, electron beam (E-beam) metrology, etc.

Metrology devices used for, e.g., thin film metrology and Optical Critical Dimension (OCD) metrology, and other types of measurements, illuminate a sample with a probe beam of electromagnetic radiation and the reflected or transmitted signal is detected and analyzed. The measurement spot is the area on the surface of the sample from which light is reflected (or transmitted through) and subsequently received by the detector of the optical metrology device. The probe beam generally does not produce a measurement spot with sharp edges or boundaries; instead, the probe beam has an intensity distribution such that the total beam power is confined in a small area, i.e., the measurement spot.

The target area that is measured by the optical metrology device may be a specifically designed target, e.g., placed within scribe lines between the processed dies on the substrate or may be in-device, e.g., a specific region that is within the die. The target area may be determined by structures or features of the sample produced during processing. The target area may be a defined area, e.g., a physical box or area that is present on the sample that is sometimes referred to as a device pad, or may be merely an undefined region on the sample that is to be measured.

For accuracy and precision, the incident probe beam should produce a measurement spot on the sample that is fully confined to the target area. If the size of the measurement spot is larger than the target area, the resulting optical signal will be contaminated by signals from regions outside the target area, making it difficult to obtain accurate measurements. As geometries of devices in semiconductor and similar industries continue to shrink, along with the corresponding target areas for the devices, it is increasingly difficult to produce measurement spots that are spatially confined to the target area. The problems associated with a measurement spot size that is larger than the target area poses a severe challenge, particularly for measurement of advanced devices.

One possible solution is to reduce the measurement spot size so that it is smaller than the target area, so that the resulting signal is solely from the target area. Reduction in the actual measurement spot size, however, requires a re-design of the optical system of current tools which is an expensive and time-consuming task. Moreover, physics imposes limits to the reduction of the measurement spot size, which may make the re-design of the optical system inadequate for some device sizes.

Another solution is to use an incoherent mixed model, which models the mixed signals from the target area and surrounding region based on the assumption that these signals are mixed incoherently in intensity domain. However, the assumption of incoherent signal mixing is not necessarily valid as coherent signal mixing may also take place. Moreover, the incoherent mixed model relies on structural information of the surrounding region that, however, is typically unknown and often irregular (e.g., non-periodic, with arbitrary defects), and consequently, difficult if not impossible to model.

As discussed herein, the contamination of signal from the non-target regions may be reduced or eliminated to generate accurate measurements. The contamination of the signal may be eliminated or reduced based on a modeling approach or a machine learning approach. The modeling approach uses a mixed model that is based on the pure target model together with a term of local gradient for measured signals that may be used to absorb the signal contamination from surrounding non-target regions. The machine learning approach uses the variation in the pattern of a plurality of spectra to predict the signal from the target region without contamination from surrounding non-target regions. Either approach requires no re-design of the metrology system and, accordingly, may use data collected from current tools. Additionally, the approaches discussed herein are not limited to the large measurement spot and small target area use cases, but may be applied to any case containing an unvaried target region and a varied and unknown non-target region.

Both the local gradient based mixed model approach and the machine learning approach use local signals as direct inputs, so that they may be applied to any type of data, such as ellipsometric data like Muller matrix (MM), Jones matrix, psi & delta data; reflectometric data like reflectance collected at different polarizer angles; interferometric data; Fourier-Transform Infrared Spectroscopy (FTIR) data, etc.

FIG. 1 shows a schematic view of a metrology device 100, including a head 102 coupled to a computing system 160 that is configured to reduce or eliminate the contamination of the signal from non-target regions as discussed herein. The metrology device 100 illustrated in FIG. 1 is a normal incidence system and may be, e.g., a reflectometer, spectroscopic reflectometer, FTIR, or any other normal incidence metrology device. If desired, multiple heads, i.e., different metrology devices, may be combined in the metrology device 100. The computing system 160 may be configured to analyze the data obtained from the sample 130 by the metrology device 100 as well as control the movement of a stage 120 that holds the sample 130 via actuators 121 and/or the head 102. The stage 120 may be capable of horizontal motion in either Cartesian (i.e., X and Y) coordinates, as indicated by arrows 123 and 124, or Polar (i.e., R and θ) coordinates or some combination of the two. The stage 120 and/or head 102 may also be capable of vertical motion, e.g., for focusing.

The head 102 may include an optical system 104 including a light source 106, such as a Xenon Arc lamp and/or a Deuterium lamp, that produces light that is incident on the target, and a detector 116, such as a spectrometer including a wavelength dispersion element and camera, that detects light from the target produced in response to the light incident on the target. In operation, light produced by the light source 106 may be directed along an optical axis 108, e.g., via beam splitter 110, toward the sample 130 which includes a target area 132. The target area 132 may be a specifically designed target, e.g., device pad, or may be a portion of the device itself. An objective 112 focuses the light onto the target area 132 and receives light that is reflected from the target area 132. The reflected light may pass through the beam splitter 110 and is focused with lens 114 onto the detector 116. The detector 116 provides a data signal to the computing system 160. The objective 112, beam splitter 110, lens 114, and detector 116 are merely illustrative of typical optical elements that may be used. Additional optical elements, such as a polarizer and/or analyzer, may be used if desired. Moreover, generally, additional optical elements such as field stops, lenses, etc. may be present in the optical system 104.

The optical system 104 produces a measurement spot on the surface of the sample 130. The measurement spot has a spot size that is constrained by the components of the optical system 104. As discussed, it is desirable for the measurement spot size to be smaller than the size of the target area 132 so that the reflected light received by the optical system 104 is only from the target area 132 and does not include light reflected from the target neighborhood, i.e., areas on the sample 130 outside and around the target area 132. As the geometries of devices in semiconductor and similar industries continue to shrink, the size of targets similarly decreases making it more difficult to produce a measurement spot size that is smaller than the target. Accordingly, in some cases, e.g., if the measurement spot size to be larger than the size of the target area 132 or if the measurement spot is not properly aligned with the target area 132, the reflected light received by the optical system 104 may be reflected from not only the target area 132 but also off-target regions.

The computing system 160 is coupled to the head 102 and receives a signal from detector 116, which may be contaminated by non-target regions, and may reduce or eliminate the contamination of the signal based on a modeling approach or a machine learning approach, as discussed herein, to perform measurements of at least one parameter of the sample 130. The computing system 160, for example, may be a workstation, a personal computer, central processing unit or other adequate computer system, or multiple systems. It should be understood that the computing system 160 may be a single computer system or multiple separate or linked computer systems, which may be interchangeably referred to herein as computing system 160, at least one computing system 160, one or more computing systems 160. The computing system 160 may be included in or is connected to or otherwise associated with metrology device 100. Different subsystems of the metrology device 100 may each include a computing system that is configured for carrying out steps associated with the associated subsystem. The computing system 160 may be communicatively coupled to the detector 116 in any manner known in the art. For example, the computing system 160 may be coupled to a separate computing system that is associated with the detector 116. The computing system 160 may be configured to receive and/or acquire metrology data or information from one or more subsystems of the metrology device 100, e.g., the detector 116, by a transmission medium that may include wireline and/or wireless portions. The transmission medium, thus, may serve as a data link between the computing system 160 and other subsystems of the metrology device 100.

The computing system 160 includes at least one processor 162 with memory 164, as well as a user interface (UI) 168, which are communicatively coupled via a bus 161. The memory 164 or other non-transitory computer-usable storage medium, includes computer-readable program code 166 embodied thereof and may be used by the computing system 160 for causing the one or more computing systems 160 to control the metrology device 100 and to perform the functions discussed herein, including eliminating or reducing the contamination of the signal based on a modeling approach or a machine learning approach. For example, as illustrated, memory 164 may include computer-readable program code 166 or instructions for causing the processor 162 to perform modeling 166m or machine learning (ML) 166ml, as discussed herein. It should be understood that the processor 162 may be configured to perform only one of modeling 166m and machine learning 166ml or may be configured to perform both modeling 166m and machine learning 166ml.

The computing system 160 may be additionally configured to analyze the acquired data and determine one or more parameters of the sample 130 under test. The results of the analysis of the data, e.g., to characterize the parameters of a device structure under test may be reported, e.g., stored in memory 164 associated with the sample 130 and/or indicated to a user via UI 168, an alarm or other output device. Moreover, the results from the analysis may be reported and fed forward or back to the process equipment to adjust the appropriate fabrication steps to compensate for any detected variances in the fabrication process. The computing system 160, for example, may include a communication port 169 that may be any type of communication connection, such as to the internet or any other computer network. The communication port 169 may be used to receive instructions that are used to program the computing system 160 to perform any one or more of the functions described herein and/or to export signals, e.g., with measurement results and/or instructions, to another system, such as external process tools, in a feed forward or feedback process in order to adjust a process parameter associated with a fabrication process step of the samples based on the measurement results.

The data structures and software code for automatically implementing one or more acts described in this detailed description can be implemented by one of ordinary skill in the art in light of the present disclosure and stored, e.g., on a computer-usable storage medium, e.g., memory 164, which may be any device or medium that can store code and/or data for use by the computing system 160. The computer-usable storage medium may be, but is not limited to, include read-only memory, a random access memory, magnetic and optical storage devices such as disk drives, magnetic tape, etc. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

Figure 2:
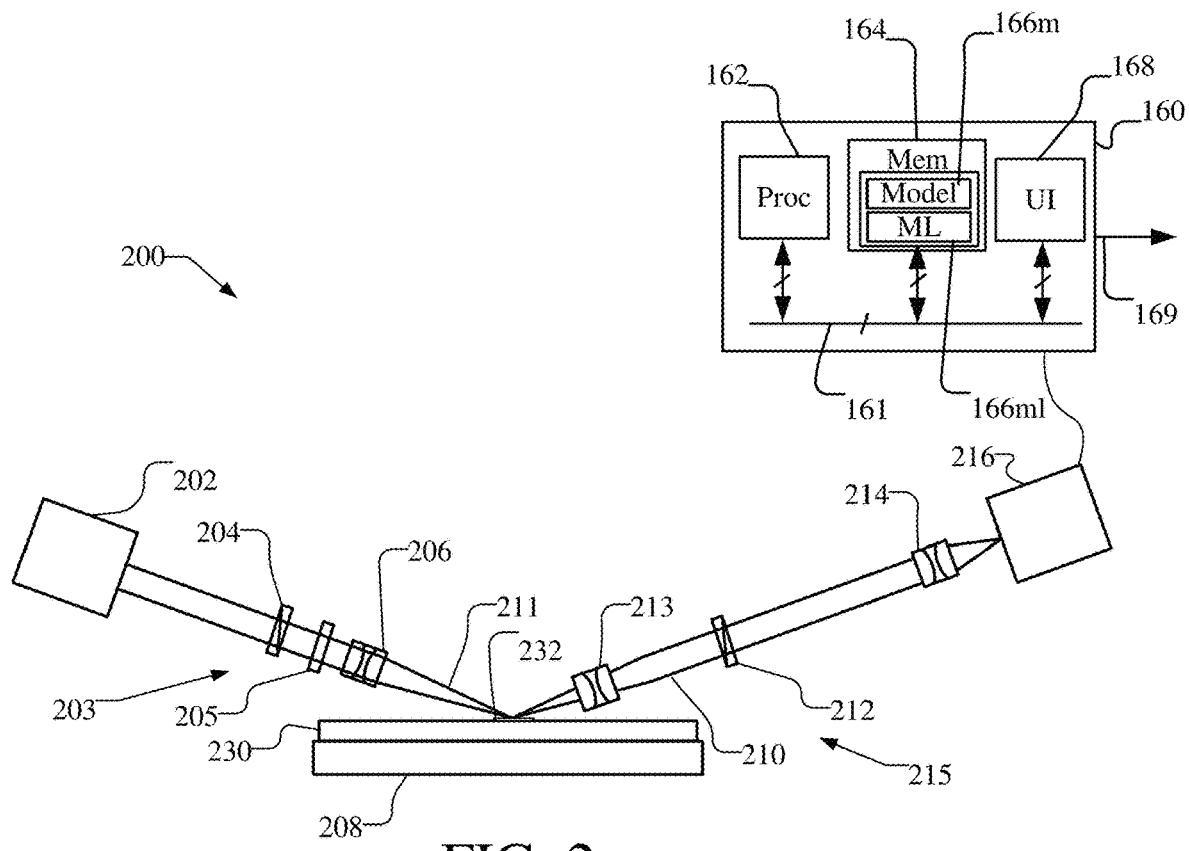
FIG. 2 shows a schematic view of a metrology device configured to reduce or eliminate the contamination of the signal from non-target regions.

FIG. 2 shows a schematic view of another metrology device 200 that may be coupled to the computing system 160 that is configured to reduce or eliminate the contamination of the signal from non-target regions as discussed herein. The metrology device 200 illustrated in FIG. 2 can be an oblique incidence system and may be, e.g., an ellipsometer, spectroscopic ellipsometer, Mueller matrix ellipsometer, etc. If desired, multiple heads, i.e., different metrology devices, may be combined in the same metrology device 200. The operation of the computing system 160 to reduce or eliminate the contamination of the signal from non-target regions may be similar to that discussed above in FIG. 1, but when coupled to metrology device 200, the computing system 160 is further configured to analyze the acquired data by metrology device 200, e.g., ellipsometery, and determine one or more parameters of the sample under test.

Metrology device 200 is illustrated as including a broadband light source 202 and a polarization state generator 203 with a polarizer 204 and a rotating compensator 205, as well as a lens system 206 that focuses the illuminating light 211 into a measurement spot on the surface of a sample 230 that is positioned on a stage 208. The incident illuminating light 211 has a known polarization state due to the polarizer 204 and rotating compensator 205. The polarization state of the light reflected by the sample 230 is analyzed by a polarization state analyzer 215, e.g., by passing the reflected light 213 through another polarizer, commonly referred to as analyzer 212, after passing through another lens system 210. After passing through the analyzer 212, the reflected light 213 is focused by a lens system 214 on a detector 216, e.g., spectrometer, that is coupled to the computing system 160. In use, a sample under test will change the polarization state of the incident light, which will change the amplitude and phase of the resulting signal from the detector 216. Using the change in intensity and phase, the material properties of the sample 230 may be determined, which is the essence of ellipsometry and is well known in the art.

The optical system of the spectroscopic metrology device 200 produces a measurement spot on the surface of the sample 230, which includes target area 232. Again, the size of the measurement spot is constrained by the components of the system of the metrology device 200. In some cases, e.g., the measurement spot size may be larger than the size of the target area 232 or the measurement spot may not be properly aligned with the target area 232, and consequently, the reflected light may be reflected from not only the target area 232 but also off-target regions. The computing system 160 coupled to receive the signal from detector 216, which may be contaminated by non-target regions, may be configured to reduce or eliminate the contamination of the signal based on a modeling approach or a machine learning approach, as discussed herein, to perform measurements of at least one parameter of the sample 230.

It should be understood that while a spectroscopic reflectometer and spectroscopic ellipsometer are specifically discussed herein, the process used to reduce or eliminate contamination of the signal from non-target regions is not limited thereto. The reduction or elimination of contamination of the signal from non-target regions as discussed herein may be applicable to any desired optical metrology device.

Figures 3A, 3B:
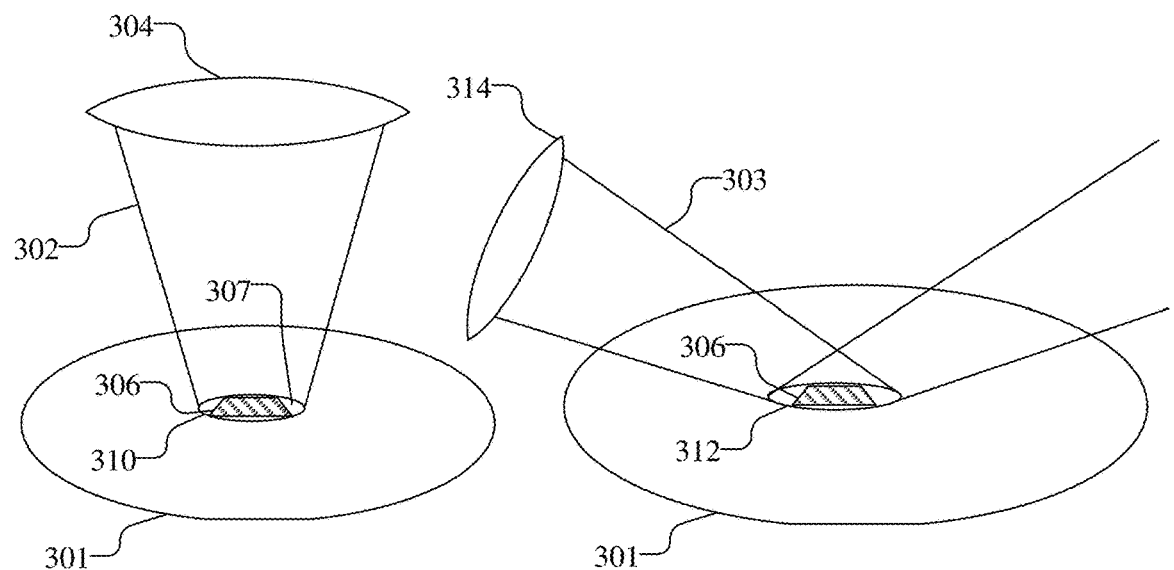
FIGS. 3A and 3B illustrate measurement spots on the surface of a sample produced by normal incidence and oblique incidence illumination, respectively.

FIG. 3A illustrates a measurement spot 310 on the surface of a sample 301 produced by normal incidence illumination 302, such as that produced by metrology device 100 in FIG. 1. The measurement spot 310 is illustrated as being produced with a lens 304 that is refractive, but a reflective lens may be used. As illustrated, the measurement spot 310 is incident on a target area 306, which is shown with cross-hatching and with a greatly exaggerated size relative to the sample 301 for clarity. The target area 306 may be determined by structures or features of the sample 301 and may be a physically designated area on the sample, e.g., a device pad that may be a square or box that is manufactured on the surface of a sample, or it may be merely an undefined region on the sample that is to be measured. The spot size of the measurement spot 310 is determined by the optical system of the metrology device, e.g., represented by lens 304. As can be seen in FIG. 3A, the spot size of the measurement spot 310 is illustrated as being larger than the target area 306. Thus, the signal received by the metrology device will include a mixture of light reflected from the target area 306 as well as light reflected from non-target areas 307, i.e., surrounding locations that are outside the target area 306. However, the contamination of the signal by non-target regions may be reduced or eliminated through the use of a modeling approach that uses a mixed model based on a target model together with a term of local spectral gradient or through the use of a machine learning approach that uses the variation in the pattern of a plurality of spectra to predict the signal from the target area.

FIG. 3B is similar to FIG. 3A, showing a measurement spot 312 that may be produced by oblique illumination 303, such as that produced by metrology device 200 in FIG. 2. The measurement spot 312 is illustrated as being produced with a lens 314 that is reflective, but a refractive lens may be used if desired. The spot size of the measurement spot 312 is determined, e.g., by lens 314, and is illustrated as being greater than the target area 306. Additionally, as illustrated, the oblique illumination 303 is obliquely incident on the surface of the sample 301 producing an enlarged measurement spot 312 in the shape of an ellipse. The contamination of the resulting signal from non-target regions, i.e., outside the target area 306, may be reduced or eliminated through the use of a modeling approach that uses a mixed model based on a target model together with a term of local spectral gradient or through the use of a machine learning approach that uses the variation in the pattern of a plurality of spectra to predict the signal from the target area.

Figure 3C:
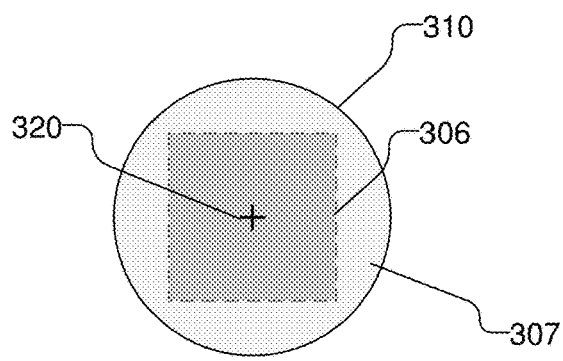
FIGS. 3C and 3D, respectively, illustrate a top view of the measurement spot produced by a metrology device and a graph of the measured spectrum relative to the true spectrum.

FIG. 3C illustrates a top view of the measurement spot 310 produced by a metrology device and illustrated in FIG. 3A. The measurement spot 310 is illustrated in FIG. 3C with a center (illustrated with cross pattern 320) that is aligned with the center of the target area 306. The measurement spot 310 is illustrated as being larger than the target area 306 so that the measurement spot 310 covers at least a partially off target location, e.g., non-target areas 307.

Figure 3D:
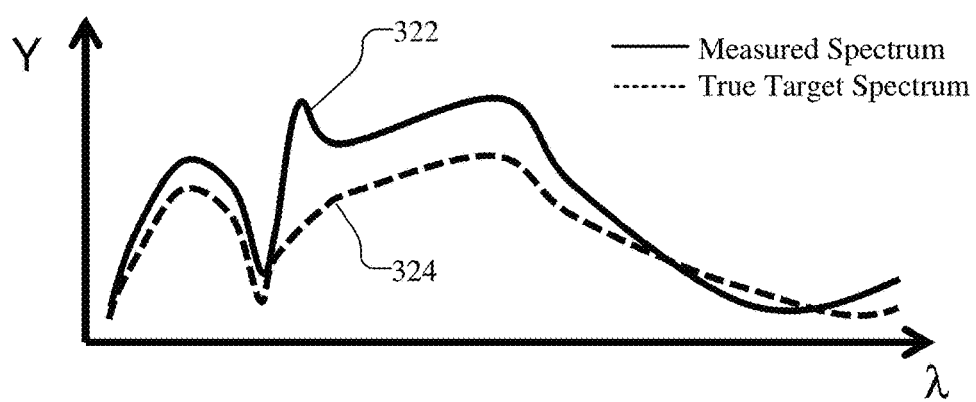

FIG. 3D is a graph illustrating the measured spectrum 322 $Y(\lambda)$ produced by the measurement spot 310. The measurement spot 310 is at least partially off target, i.e., includes non-target areas 307, and accordingly, the measured spectrum 322 is produced by the signal from the target area 306 mixed with the signal produced by the non-target areas 307. By way of comparison, the "true" target spectrum 324 is also illustrated in FIG. 3D, where the true target spectrum 324 is the spectrum that would be produced if the measurement spot 310 illuminated only the target area 306, i.e., covers only an on-target location. The measured spectrum 322 produced by mixed signals from the target area 306 and surrounding non-target areas 307 is different than the true target spectrum 324, and accordingly, parameters of the target area 306 determined using the measured spectrum 322 will be inaccurate.

During optical metrology, the measured data, e.g., measured spectrum 322, is typically compared to modeled data for the structure under test. Modeled data may be calculated using physics-based techniques such as Rigorous Coupled Wave Analysis (RCWA), Finite-Difference Time-Domain (FDTD) or Finite Element Method (FEM), which require detailed knowledge of the structure under test. For example, modeling requires that preliminary structural and material information is known about the sample in order to generate an accurate representative model of the sample, which may include one or more variable parameters. The preliminary structural and material information for a sample may include the type of structure and a physical description of the sample with nominal values for various parameters, such as layer thicknesses, line widths, space widths, sidewall angles, etc., along with a range within which these parameters may vary. The sample may further include one or more sample parameters that are not variable, i.e., are not expected to change in a significant amount during manufacturing. Typically, a library of modeled data for a plurality of parameter variations in the model may be pre-generated to increase measurement throughput, but in some instances the modeled data may be calculated in real time. The measured data is compared to the modeled data for each parameter variation, e.g., in a nonlinear regression process, until a good fit is achieved between the modeled data and the measured data, e.g., which may be determined based on the means square error (MSE). When a good fit between the measured data and the modeled data is achieved, the model parameters corresponding to the modeled data may be considered to be an accurate representation of the parameters of the structure under test.

The representative model of the structure under test typically does not include structural or material information for non-target areas. Structural information of the non-target areas, for example, is typically unknown, and may be irregular (e.g., non-periodic, with arbitrary defects), and theoretically may be difficult or impossible to model. Accordingly, when the measured data is contaminated with signals from non-target areas, e.g., as illustrated in measured spectrum 322 in FIG. 3D, and is used for determining parameters of the target area, the goodness of fit may be affected, resulting in decreased accuracy and precision in the measurement.

Figure 4A:
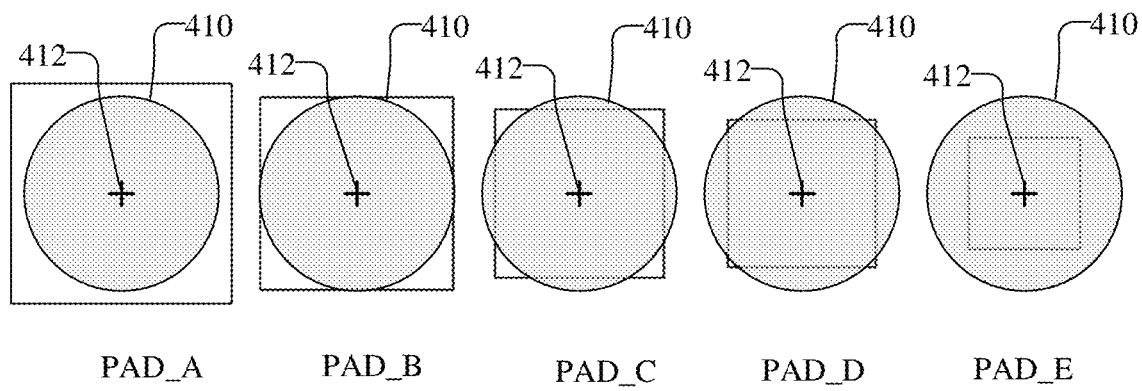
FIG. 4A illustrates a top view of a plurality of targets of different sizes and a measurement spot.

FIG. 4A illustrates a top view of a plurality of targets, labeled PAD_A, PAD_B, PAD_C, PAD_D, and PAD_E, each having a different size, e.g., 40×40 μm, 35×35 μm, 30×30 μm, 25×25 μm, and 20×20 μm, respectively. A measurement spot 410 is illustrated with a center (illustrated with cross pattern 412) that is in the center of each of the plurality of targets. The measurement spot 410, for example, may have a spot size diameter of 35 μm, and accordingly, fits completely within targets PAD_A and PAD_B when properly centered, but is larger than targets PAD_C, PAD_D, and PAD_E, and thus includes non-target areas.

Figure 4B:
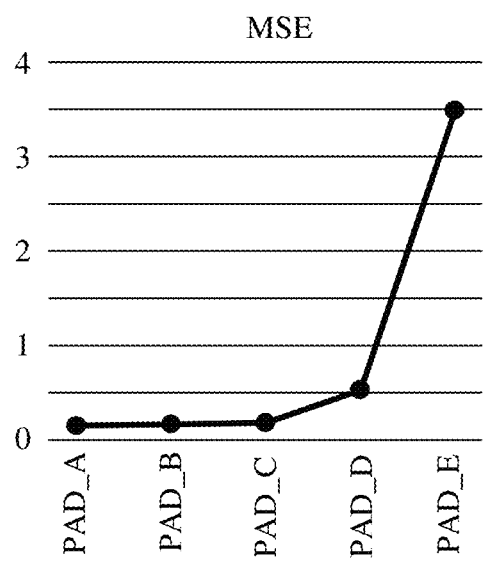
FIG. 4B is a graph illustrating the mean square error for the fit achieved for signals obtained from the measurement spots on target regions illustrated in FIG. 4A.

FIG. 4B is a graph illustrating the MSE achieved from fitting the measured data obtained from the measurement spot 410 and modeled data for each of the targets PAD_A, PAD_B, PAD_C, PAD_D, and PAD_E. The signals obtained from targets PAD_A and PAD_B are purely from the target and thus can be fitted well, i.e., low MSE, by the models for the targets. For targets PAD_C, PAD_D, and PAD_E, which are smaller than the measurement spot 410, the obtained signals are contaminated by signals from non-target areas and accordingly, the signals cannot be fit well to a model for only the target. Moreover, as can be seen, the fitting quality (e.g., MSE) is worse for targets that are relatively smaller than the measurement spot 410.

The contamination of signal from the non-target regions, e.g., caused by the measurement spot size being larger than the target area, and/or caused by misalignment of the measurement spot with the target area, may be reduced or eliminated to improve the accuracy and precision of the measurements. In one approach, the contamination of the signal may be eliminated or reduced based on a mixed model approach, which models the target area based on a pure target model (i.e., a model of only the target area) together with a term for the local signal gradient (LG) from the target area, where the signal may be a spectral signal, i.e., the local signal gradient may be a local spectral gradient, including Muller matrix (MM), Jones matrix, psi & delta data, reflectometric data, interferometric data, Fourier-Transform Infrared Spectroscopy (FTIR) data, etc., or any other measured signal, including X-ray metrology, opto-acoustic metrology, electron beam (E-beam) metrology, etc.

In a simple mixed model approach based on linear incoherent mixing of signals, the mixed signal (S) obtained from a target area is a linear incoherent mixing of the signal from the target area ($S_{tgt}$) and the signal from the surrounding non-target area ($S_{srd}$). The linear incoherent mixed signal (S) may be written as follows:

$$S = f*S_{tgt} + (1-f)*S_{srd} \qquad \text{eq. 1}$$

where f is a fraction of the target signal.

An incoherent mixed model based on equation 1 may be used to generate modeled data only if information for both the target area and the surrounding non-target area is known. However, information for the surrounding non-target area is typically not known and it is often irregular (e.g., non-periodic, arbitrary defects, etc.). Accordingly, producing an accurate incoherent mixed model is impractical.

A mixed model based on the local gradient may be produced based on reformatting equation 1 so that it contains one term for the pure target signal ($S_{tgt}$) and a separate term for the signal difference between the target area and surrounding non-target area ($S_{srd} - S_{tgt}$), as follows:

$$S = S_{tgt} + (1-f)*(S_{srd} - S_{tgt}) \qquad \text{eq. 2}$$

The second term in equation 2, i.e., the signal difference between the target area and surrounding non-target area ($S_{srd} - S_{tgt}$), may be estimated by the local signal gradient that is determined from a group of measured signals containing varied fractions of target area signals and non-target signals, e.g., from collected scan data, together with a proper coefficient c, e.g., as follows.

$$(1-f)*(S_{srd} - S_{tgt}) \approx c*LG. \qquad \text{eq. 3}$$

Accordingly, the local gradient based mixed model may be written as follows:

$$S = S_{tgt} + c*LG. \qquad \text{eq. 4}$$

In some implementations, additional or different coefficients for the local gradient may be used, such as higher order coefficients. During analysis, e.g., comparison of the measured signal and the calculated signal determined based on equation 4, the coefficient c is floated, i.e., is a variable parameter, together with the target structural parameters to absorb the contamination from the surrounding non-target area. The local gradient (LG) term is determined directly from the measured signal from a reference target, and accordingly, the local gradient based mixed model does not require structural information of the surrounding non-target area.

Figures 5A, 5B:
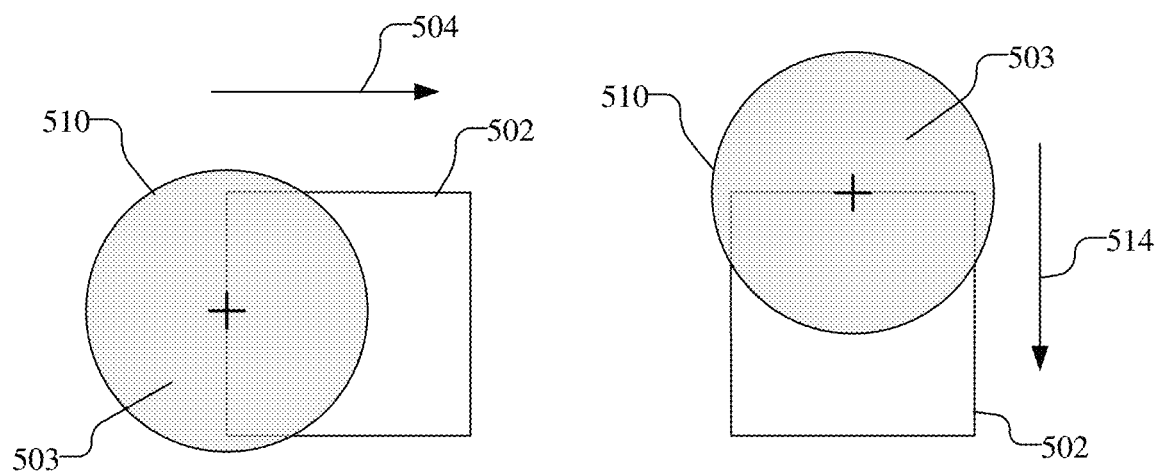
FIGS. 5A and 5B illustrate a top view of the line scan measurements of a target area by moving a measurement spot over the target area along the X axis and Y axis, respectively.

FIGS. 5A and 5B illustrate a top view of the line scan measurements of a target area 502 by moving a measurement spot 510 over the target area 502 (illustrated by arrows 504 and 514 in FIGS. 5A and 5B, respectively) while collecting data. FIG. 5A illustrates a scan along the x axis, while FIG. 5B illustrates a linear scan along the y axis. By way of example, the target area 502 may be a 30×30 μm target pad and the measurement spot size may be 35 μm. The data may be collected as the measurement spot moves in (or moves out) of the target area, with the data collected, e.g., at every 1 μm step during the scan. During the line scan measurement, as the measurement spot 510 moves across the target area 502, the collected data will contain signals from both the target area 502 and the surrounding non-target areas 503, with the fraction thereof varying as the measurement spot 510 moves. Alternatively, the scanning data collection can be of some other styles, including checkerboard style or grid style, where the local gradient can be determined by difference from their mean or difference between any two locations or fit to multiple metrology data with different levels of mixture of target and non-target signals.

Figure 6:
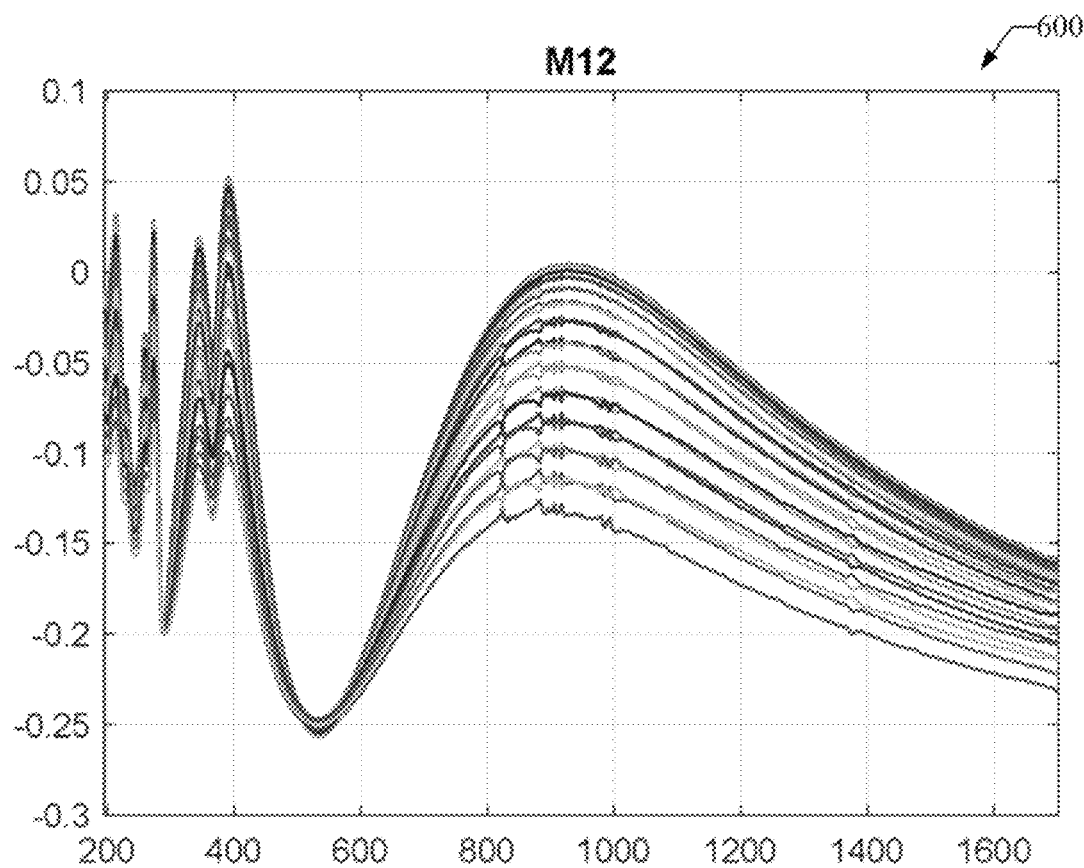
FIG. 6 is a graph illustrating an example of the differing spectral signals collected while a measurement spot is linearly scanned over a target area as illustrated in FIG. 5A.

FIG. 6 is a graph 600 illustrating an example of the differing spectral signals collected while a measurement spot is linearly scanned over a target area (e.g., as illustrated in FIG. 5A). The graph 600, for example, illustrates absolute Mueller matrix (MM) measurements for Mueller matrix m12.

The local gradient for measured signals may be determined as a derivative or rate of change of the signals measured from different positions along a spot scan, which is able to capture the spectral variations. The local gradient for measured signals may be constant or may be wavelength dependent. The local gradient for measured signals may be determined as a difference between spectra collected from two different positions, e.g., neighboring or nearby positions, e.g., $S_n$, $S_{n+1}$, where n is the scanning sequence number.

$$LG = S_{n+1} - S_n \quad \text{eq. 5}$$

The local gradient for measured signals may be generated from a left side scan of the target area, a right side scan of the target, or both. The local gradient for measured signals may be determined between two positions or from multiple positions. The two or more positions are near each other to define the "locality" of the local gradient, and for example may be, but are not required to be, adjacent during the scan. For example, a single local gradient for measured signals may be determined based on the difference between two positions, or multiple local gradients for measured signals may be determined based on the difference between multiple positions, and the multiple local gradients for measured signals may be used together in the mixed model or may be combined, e.g., averaged, to produce a single local gradient for measured signals to use in the mixed model. Moreover, to better represent the signal difference between the target area and surrounding non-target areas, a local gradient for measured signals may be determined from scan data from multiple scanning directions, e.g., X direction (as illustrated in FIG. 5A) to produce LG_X, and Y direction (as illustrated in FIG. 5B) to produce LG_Y, or any other direction. The local gradient based mixed model may contain one or more local gradients for measured signals. When the local gradient for measured signals is combined with the pure target model in a local gradient based mixed model, the local gradient for measured signals is able to absorb signals from the surrounding non-target areas, thereby allowing the measurement to approach the true value, e.g., without signal combination from the non-target areas.

In one implementation of the local gradient based mixed model, the local gradient determination may be performed for each target area or for each die. One drawback to the approach of measuring the local gradient for each target area or die is that the local gradient requires measurement of signals from multiple positions, which reduces throughput. If the local gradient shows good similarity over all target areas, the local gradient from a single reference target area may be used to represent the local gradient for other target areas. Similarly, if the local gradient shows good similarity over all dies, the local gradient from multiple target areas within a reference die may be used to represent the local gradient for the corresponding multiple target areas in other dies. For example, good matching in batch results indicates the feasibility of the use of a reference target area or reference die.

The reference target area may be a specifically designed reference pad or may be a target area under test. For example, a first target area being measured may be scanned to measure signals from multiple locations, which are used to determine the local gradient for measured signals for the first target area. In some implementations, to determine one or more parameters for the first target area, a measured signal from the first target area may be selected from the scan and used to fit to the local gradient based mixed model (which includes a model for the target area and the local gradient for measured signals determined for the first target area). During measurement of other target areas, the first target area may serve as the reference target area, i.e., the local gradient for measured signals determined for the first target area is used for other target areas.

Figure 7:
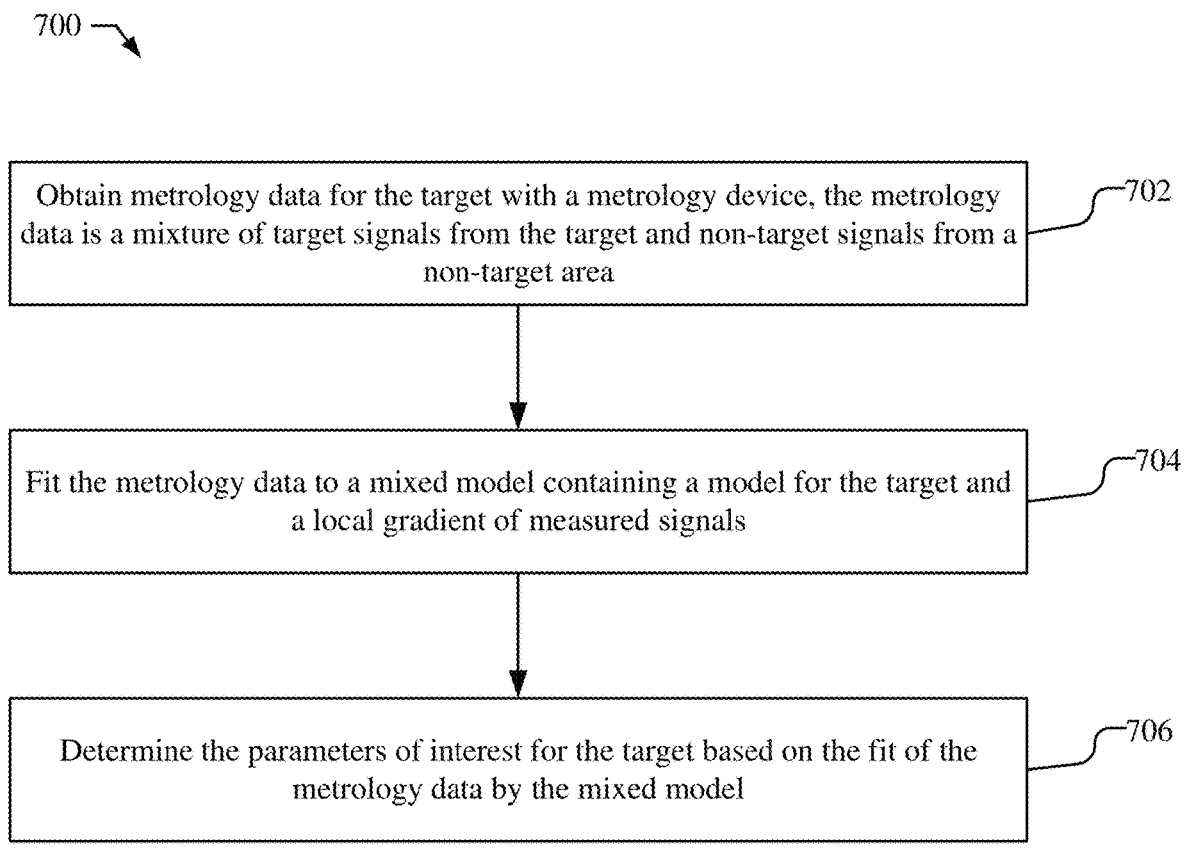
FIG. 7 shows an illustrative flowchart depicting an example method for measuring parameters of interest for a target on a sample using a local gradient based mixed model, according to some implementations.

FIG. 7 shows an illustrative flowchart depicting an example method 700 for measuring parameters of interest for a target on a sample using a local gradient based mixed model, according to some implementations. In some implementations, the example method 700 may be performed by a metrology device, such as metrology device 100 or 200, with a computing system 160 with one or more processors, e.g., such as processor 162, that may be configured to perform the functions discussed herein, including eliminating or reducing the contamination of the signal based on the local gradient based mixed model approach.

At 702, metrology data for the target is obtained with the metrology device, the metrology data is a mixture of target signals from the target and non-target signals from a non-target area, e.g., as discussed in reference to FIGS. 1, 2, and 3A-3D. The metrology device, for example, uses radiation that is incident on the sample over a measurement area, and the metrology data for the target is obtained with the metrology device from a location at which the measurement area includes both the target and the non-target area. The measurement area may be larger than the target in at least one dimension. In some implementations, the metrology data for the target may be spectral data. A means for obtaining metrology data for the target may be, e.g., the metrology device 100 or 200, including the computing system 160 with the processor 162 configured to perform as modeling, as shown in FIGS. 1 and 2.

At 704, the metrology data is fit to a mixed model containing a model for the target and a local gradient for measured signals, e.g., as discussed in reference FIGS. 5A, 5B, and 6-8. The mixed model containing the model for the target and the local gradient for measured signals, for example, is a local gradient based mixed model, as discussed herein. Fitting the metrology data to the mixed model containing the model for the target and the local gradient for measured signals, for example, may include floating the parameters of interest in the model for the target and floating at least one coefficient for the local gradient for measured signals. The mixed model may contain one or more local gradients. The local gradient may be constant or may be wavelength dependent. A means for fitting the metrology data to a mixed model containing a model for the target and a local gradient for measured signals may be, e.g., the metrology device 100 or 200, including the computing system 160 with the processor 162 configured to perform as modeling, as shown in FIGS. 1 and 2.

At 706, the parameters of interest for the target are determined based on the fit of the metrology data by the mixed model, e.g., as discussed in reference FIGS. 5A, 5B, and 6-8. A means for determining the parameters of interest for the target based on the fit of the metrology data by the mixed model may be, e.g., the metrology device 100 or 200, including the computing system 160 with the processor 162 configured to perform as modeling, as shown in FIGS. 1 and 2.

In some implementations, the method may further include obtaining a local gradient metrology data set by acquiring a plurality of measured signals from different locations, where the measured signal from each different location is a different mixture of target signal and non-target signal, e.g., as discussed in reference to FIGS. 5A, 5B, and 6-8. A means for obtaining a local gradient metrology data set by acquiring a plurality of measured signals from different locations, where the measured signal from each different location is a different mixture of target signal and non-target signal by, e.g., the metrology device 100 or 200, including the computing system 160 with the processor 162 configured to perform as modeling, as shown in FIGS. 1 and 2. The method may further include determining the local gradient for measured signals based on a difference in measured signals from the different locations in the local gradient metrology data set, e.g., as discussed in reference to FIGS. 5A, 5B, and 6-8. A means for determining the local gradient for measured signals based on a difference in measured signals from the different locations in the local gradient metrology data set may be, e.g., the metrology device 100 or 200, including the computing system 160 with the processor 162 configured to perform as modeling, as shown in FIGS. 1 and 2.

In some implementations, the local gradient metrology data set may be acquired from the target under test. For example, the metrology data for the target may be one data selected from the local gradient metrology data set.

In some implementations, the local gradient metrology data set may be acquired from a reference target. The reference target, for example, may have nominal values of the parameters of interest that are the same as the target. For example, the reference target may be on the sample with the target. For example, the reference target may be on a different sample than the target. The different sample, for example, may be fabricated under the same conditions as the target.

In some implementations, the local gradient metrology data set for the target may be obtained by acquiring the plurality of measured signals from different locations along at least one scan in at least one dimension.

In another approach, the contamination of the signal may be eliminated or reduced based on a machine learning approach that uses the variation in the pattern of a plurality of signals to predict the signal from the target area without signal contamination from surrounding non-target areas.

The variation in the pattern of a plurality of signals is produced as the measurement spot is moved from a location where the measurement spot is partially incident on the target area to a location where the measurement spot is fully incident on the target area. As the measurement spot is scanned over the target area, the collected signal will display a well-formed pattern that is governed by the movement of measurement spot from being partially incident on the target area to being fully incident on the target area, which can be controlled experimentally. Thus, a machine learning model may be built to recognize the pattern of the signal change from the movement of the measurement spot. The machine learning model may be trained with the signal, e.g., spectra or other measurement data, collected at a plurality of locations with respect to the target area as the measurement spot is scanned over the target area. The signal, for example, may be collected as the measurement spot is moved at a constant step size. The trained machine learning model may be used to predict the signal of the next (or any other desired) movement step of the measurement spot. The final predicted signal will represent the accurate signal as if it were collected with the measurement spot fully incident on the measurement target.

Figure 8A:
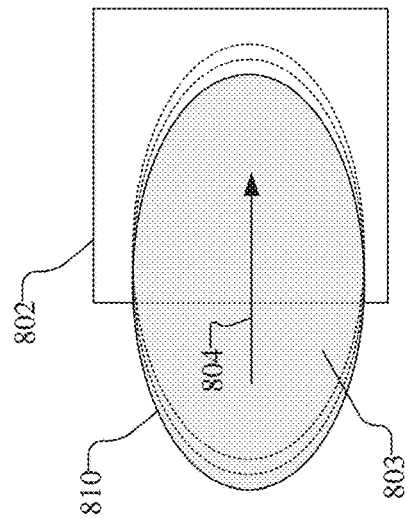
FIG. 8A illustrates a top view of the line scan measurements of a target area by moving a measurement spot over the target area.
Figure 8A:
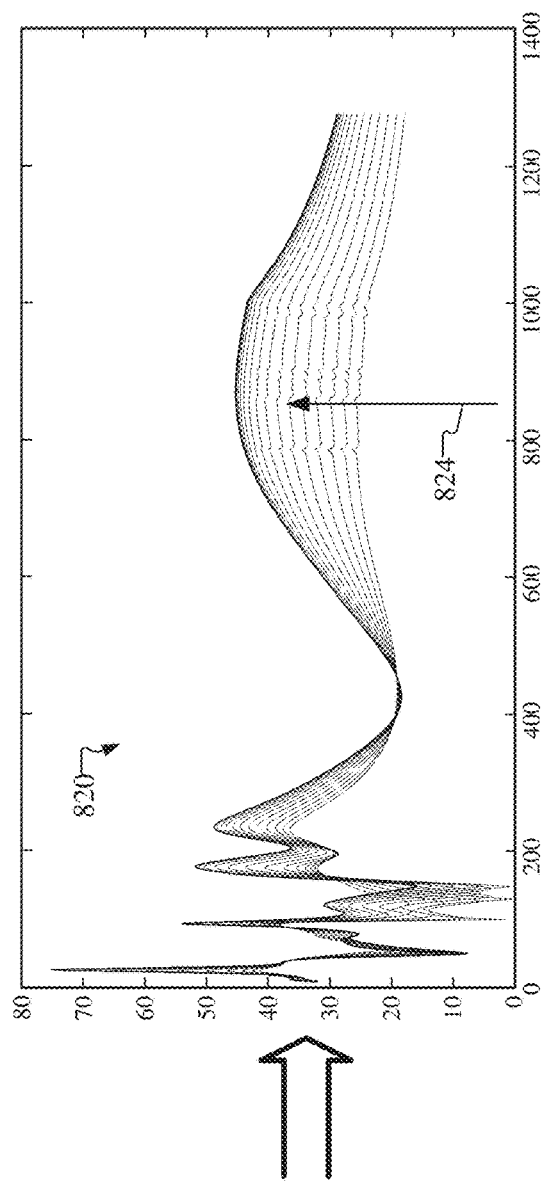

FIG. 8A illustrates a top view of the line scan measurements of a target area 802 by moving a measurement spot 810 over the target area 802 (illustrated by arrow 804 and dotted lines) while collecting data. FIG. 8A illustrates the measurement spot 810 as an ellipse, e.g., as produced by obliquely incident light from metrology device 200, but may be circular if produced by normally incident light from metrology device 100. As illustrated, the measurement spot 810 may be larger than the target area 802, at least in one dimension, which will result in a signal (i.e., measured spectra) that is contaminated by signals from surrounding non-target areas 803. For example, the target area 802 may be a 30×30 µm target pad and the measurement spot size may be 40 µm along one axis. The measurement spot 810 may be scanned across the target area 802 at consistent steps, e.g., of 1 µm. FIG. 8A further illustrates a graph 820 of the spectral signals collected from the measurement spot 810 as it scanned over the target area 802 (e.g., as illustrated in FIG. 8A). The collected signals are a mixture of target signals from the target area 1002 and non-target signals from non-target area 803. The change in the spectral signal in graph 820 as the measurement spot 810 is scanned across the target area 802 is illustrated with arrow 824.

The machine learning model may be trained based on the mixed signals collected over a plurality of locations, where the trained machine learning model predicts the signal of the next (or other desired) step of the measurement spot based on prior measured locations. For example, the machine learning model may be trained by performing regression to minimize the difference between the two sides of the following equation:

$$f(Mi, Mj) = Mk \qquad \text{eq. 6}$$

where i, j, and k are indices representing different locations along the scan of the measurement spot across the target area, M represents the measured signal, and f(•) represents the machine learning model.

Figure 8B:
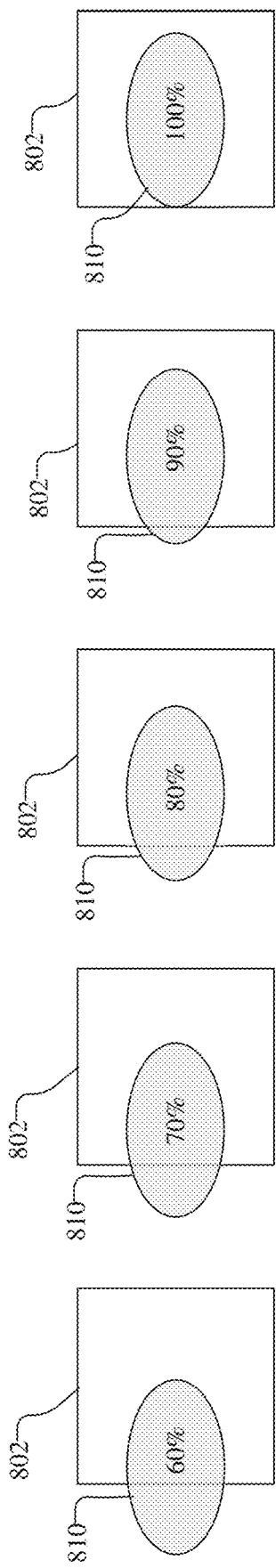
FIG. 8B illustrates a top view of the target area with the measurement spot positioned at different locations and covering differing percentages of the target area.

FIG. 8B, by way of example, shows a plurality of illustrations of a top view of the target area 802 with different percentages of the measurement spot 810 covering the target area 802, e.g., 60%, 70%, 80%, 90%, and 100%. It should be understood that the relative size of the measurement spot 810 to the target area 802 is exaggerated and that the measurement spot 810 may be larger than the target area 802 as shown in FIG. 8B. It should be further understood that the percentage of coverage of the target area 802 by the measurement spot 810 is equivalent to the location of the measurement spot 810 relative to the target area 802.

As an example, based on equation 6 and with reference to FIG. 8B, the machine learning model may be trained by performing regression to minimize the difference between the two sides of the following equations:

$$f(M60\%, M70\%) = M80\% \qquad \text{eq. 7}$$

$$f(M70\%, M80\%) = M90\% \qquad \text{eq. 8}$$

Once trained, the machine learning model may predict the target signal produced only from the target area 802, i.e., as if the measured signal were acquired from only the target so that the target signal does not include the non-target signal from the surrounding non-target area (M100%), as:

$$f(M80\%, M90\%) = M100\%. \qquad \text{eq. 9}$$

Thus, even if the measurement spot 810 is larger than the target area 802, the machine learning model may be trained to predict an accurate signal for the target area 802 (M100%), e.g., as produced by the measurement spot 810 without the contaminating signal from the surrounding non-target area.

The machine learning model may be further used for dynamic noise reduction. For example, while the machine learning model may be trained based on equations 7 and 8 for accuracy improvement, when dynamic precision signals of the right-hand side of the equations are available, the data may be further processed by taking the mean spectra of multiple cycles (cy1, cy2 . . . cyk), which may then be used as training labels for machine learning model training, as illustrated as follows:

$$M80\%\_mean = (M80\%\_cy1 + M80\%\_cy2 + \ldots + M80\%\_cyk)/k. \qquad \text{eq. 10}$$

The machine learning model may be trained by performing regression to minimize the difference between the two sides of all the following equations.

$$f(M60\%\_cy1, M70\%\_cy1) = M80\%\_mean,$$
$$f(M60\%\_cy2, M70\%\_cy2) = M80\%\_mean, \ldots,$$
$$f(M60\%\_cyk, M70\%\_cyk) = M80\%\_mean \qquad \text{eq. 11}$$

$$M80\%\_mean = M80\%\_cy1 + M80\%\_cy2 + \ldots + M80\%\_cyk)/k \qquad \text{eq. 12}$$

$$f(M70\%\_cy1, M80\%\_cy1) = M90\%\_mean,$$
$$f(M70\%\_cy2, M80\%\_cy2) = M90\%\_mean, \ldots,$$
$$f(M70\%\_cyk, M80\%\_cyk) = M90\%\_mean \qquad \text{eq. 13}$$

$$M90\%\_mean = M90\%\_cy1 + M90\%\_cy2 + \ldots + M90\%\_cyk)/k \qquad \text{eq. 14}$$

A well-trained machine learning model may predict the signal without the signal contaminations from surrounding non-target areas and with reduced dynamic noise as follows:

$$f(M80\%\_cy1, M90\%\_cy1) = M100\%\_cy1,$$
$$f(M80\%\_cy2, M90\%\_cy2) = M100\%\_cy2, \ldots,$$
$$f(M80\%\_cyk, M90\%\_cyk) = M100\%\_cyk \qquad \text{eq. 15}$$

$$M100\%\_mean = M100\%\_cy1 + M100\%\_cy2 + \ldots + M100\%\_cyk)/k \qquad \text{eq. 16}$$

In some implementations, the machine learning model may be trained using a plurality of measurement targets for signal collection. The collected signals from the plurality of measurement targets may be used to generate the training data for the machine learning model, but no other reference metrology may be necessary. The plurality of measurement targets, for example, may cover the typical process conditions for the device. The more signals that are collected and the more measurement targets that are used, typically, the better the yield for the machine learning model. The signals may be collected from each measurement target using a scan, e.g., as illustrated in FIG. 8A, with the measurement spot moving by a known, and in some implementations, a constant step distance, e.g., 1 μm. Once trained, the machine learning model may then be deployed on metrology devices.

Figure 9:
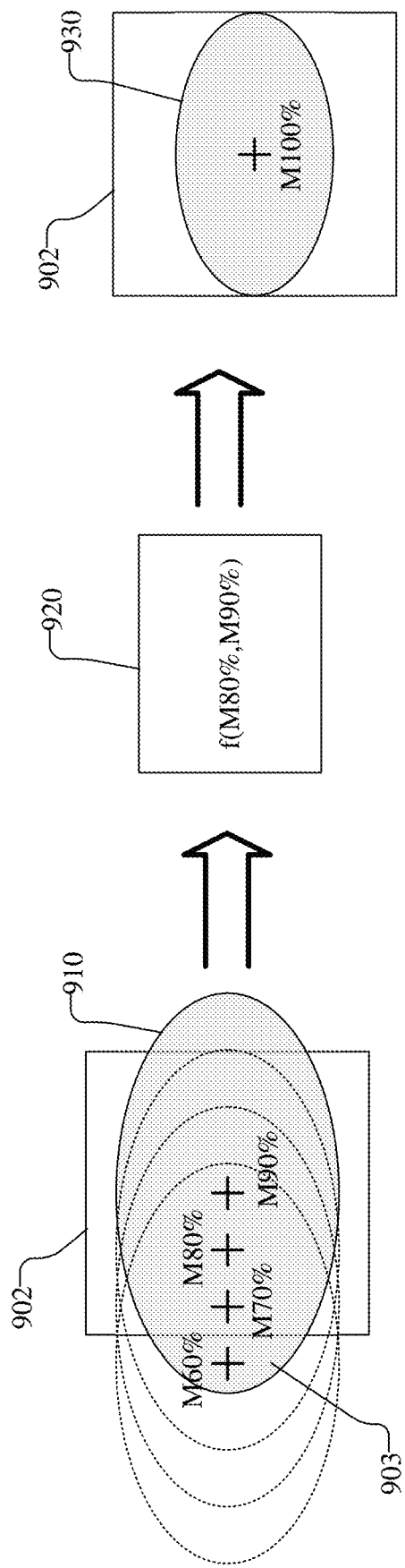
FIG. 9 illustrates measuring parameters of interest of a target area using a trained machine learning model.

FIG. 9 illustrates measuring parameters of interest of a target area 902 using a trained machine learning model 920 to eliminate or reduce the contamination of the measured signal from surrounding non-target areas 903. A plurality of measured mixed signals is obtained from different positions using a measurement spot 910, which may have a spot size that is larger than the size of the target area 902 in at least one dimension and/or may be misaligned with the target area 902. Each mixed signal is a mixture of target signal from the target area 902 and non-target signal from the non-target area 903. The measurement spot 910 is illustrated with dotted lines with the measurement spot center (illustrated with cross patterns) at different positions to illustrate obtaining measured signals M from a number of different locations. In FIG. 9, the different locations are identified based on the percentage of the measurement spot 910 that is covering the target area 902 and the corresponding measured signals M obtained from each respective position is labeled accordingly, e.g., M90%, M80%, M70%, and M60%. The measured signals may be collected from the target area under measurement by moving measurement spot by a known, and in some implementations, a constant step distance, e.g., 1 μm, which may be the same distance used to generate training data for the machine learning model. One of the locations from which measured signals is obtained should be the location on the target area 902 that provides the most accurate signal, e.g., M90%. The location from which the most accurate signal may be obtained may be determined from the line scan signals obtained during training. If desired, e.g., to increase throughput, measured signals may be obtained from only two locations.

At least two of the measured mixed signals (which may include the most accurate signal) are provided as input data to the trained machine learning model 920. The machine learning model 920 receives the measured mixed signals, e.g., M80% and M90% and outputs an improved signal M100%, that reduces or eliminates non-target signals from the non-target area 903. The machine learning model 920, thus, determines a target signal for the target, e.g., as if the measurement spot 910 is incident on only the target area 902 and is not incident on surrounding non-target area 903, thereby reducing or eliminating signal contamination from non-target areas. Functionally, the improved signals M100% is equivalent to a measured signal from a smaller measurement spot 930 that is incident on only the target area 902, as illustrated in FIG. 9. After determining the improved signal, e.g., the improved signal may be used to determine one or more parameters of the target area, e.g., by fitting the improved signal to modeled data for the target area until a good fit is achieved.

Figure 10:
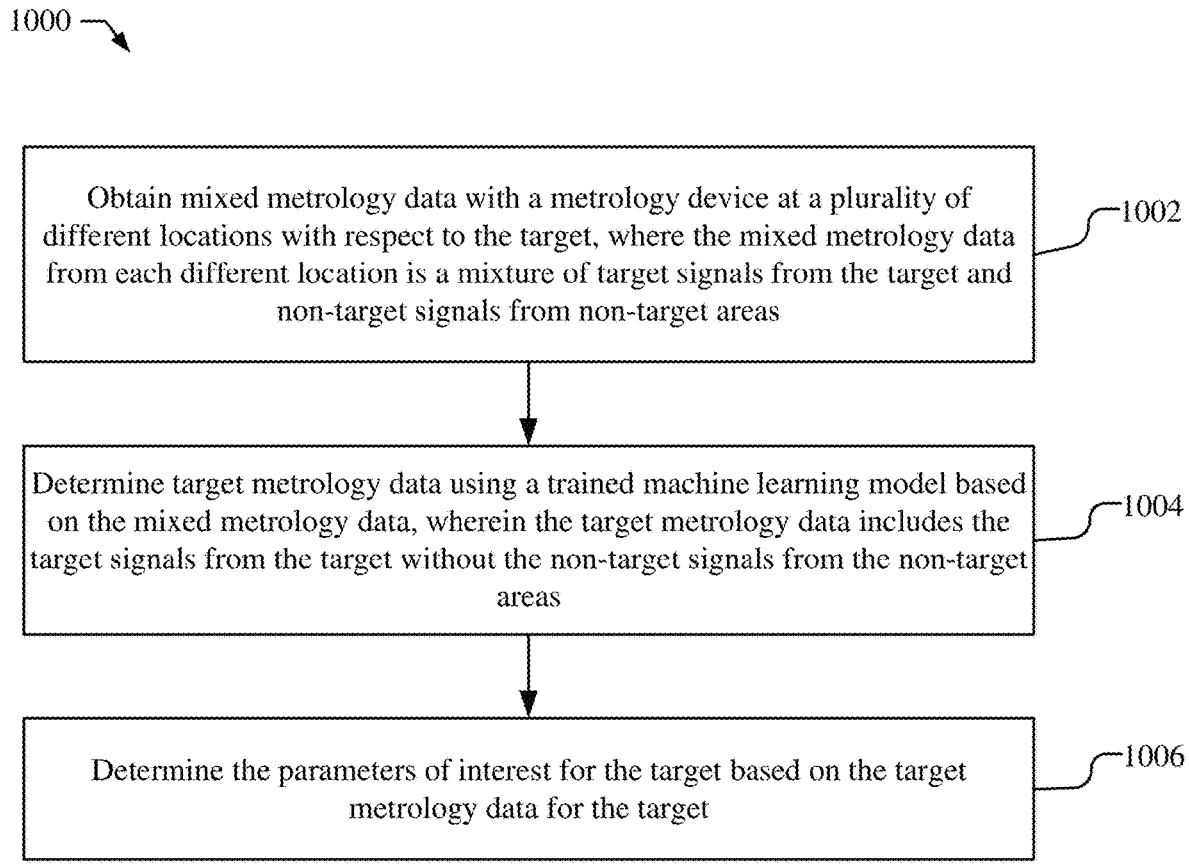
FIG. 10 shows an illustrative flowchart depicting an example method for measuring parameters of interest for a target on a sample using a machine learning model, according to some implementations.

FIG. 10 shows an illustrative flowchart depicting an example method 1000 for measuring parameters of interest for a target on a sample using a machine learning model, according to some implementations. In some implementations, the example method 1000 may be performed by a metrology device, such as metrology device 100 or 200, with a computing system 160 with one or more processors, e.g., such as processor 162, that may be configured to perform the functions discussed herein, including eliminating or reducing the contamination of the signal based on a machine learning model approach.

As illustrated, at 1002, mixed metrology data is obtained with a metrology device at a plurality of different locations with respect to the target, where the mixed metrology data from each different location is a mixture of target signals from the target and non-target signals from a non-target area, e.g., as discussed in reference to FIG. 9. In some implementations, the metrology device uses radiation that is incident on the sample over a measurement area and the measurement area is larger than the target, e.g., as illustrated in FIGS. 8A, 8B and 9. The metrology data for the target, for example, may be spectral data. A means for obtaining mixed metrology data with a metrology device at a plurality of different locations with respect to the target, where the mixed metrology data from each different location is a mixture of target signals from the target and non-target signals from the non-target area may be, e.g., the metrology device 100 or 200, including the computing system 160 with the processor 162 configured to perform as machine learning modeling, as shown in FIGS. 1 and 2.

At 1004, target metrology data is determined using a trained machine learning model based on the mixed metrology data, where the target metrology data includes target signals from the target without the non-target signals from the non-target area, e.g., as discussed in reference to FIG. 9. A means for determining target metrology data using a trained machine learning model based on the mixed metrology data, where the target metrology data includes target signals from the target without the non-target signals from the non-target area may be, e.g., the metrology device 100 or 200, including the computing system 160 with the processor 162 configured to perform as machine learning modeling, as shown in FIGS. 1 and 2, and the machine learning model discussed in reference to FIGS. 8A, 8B, and 9.

At 1006, the parameters of interest are determined for the target based on the target metrology data for the target, e.g., as discussed in reference to FIG. 9. A means for determining the parameters of interest for the target based on the target metrology data for the target may be, e.g., the metrology device 100 or 200, including the computing system 160 with the processor 162 configured to perform as machine learning modeling, as shown in FIGS. 1 and 2.

The above description is intended to be illustrative, and not restrictive. For example, the above-described examples (or one or more aspects thereof) may be used in combination with each other. Other implementations can be used, such as by one of ordinary skill in the art upon reviewing the above description. Also, various features may be grouped together and less than all features of a particular disclosed implementation may be used. Thus, the following aspects are hereby incorporated into the above description as examples or implementations, with each aspect standing on its own as a separate implementation, and it is contemplated that such implementations can be combined with each other in various combinations or permutations. Therefore, the spirit and scope of the appended claims should not be limited to the foregoing description.

What is claimed is:

1. A method for measuring parameters of interest for a target on a sample, comprising:
   obtaining metrology data for the target with a metrology device, the metrology data is a mixture of target signals from the target and non-target signals from a non-target area;
   fitting the metrology data to a mixed model containing a model for the target and a local gradient of measured signals; and
   determining the parameters of interest for the target based on the fit of the metrology data by the mixed model.

2. The method of claim 1, wherein the metrology device uses radiation that is incident on the sample over a measurement area, and the metrology data for the target is obtained with the metrology device from a location at which the measurement area includes both the target and the non-target area.

3. The method of claim 2, wherein the measurement area is larger than the target in at least one dimension.

4. The method of claim 1, further comprising:
   obtaining a local gradient metrology data set by acquiring a plurality of measured signals from different locations, where the measured signals from each different location is a different mixture of target signals and non-target signals; and
   determining the local gradient of measured signals based on a difference in measured signals from the different locations in the local gradient metrology data set.

5. The method of claim 4, wherein the local gradient metrology data set is acquired from the target.

6. The method of claim 5, wherein the metrology data for the target is selected from the local gradient metrology data set.

7. The method of claim 4, wherein the local gradient metrology data set is acquired from a reference target.

8. The method of claim 7, wherein the reference target is on the sample with the target.

9. The method of claim 7, wherein the reference target is on a different sample than the target.

10. The method of claim 4, wherein the local gradient metrology data set for the target is obtained by acquiring the plurality of measured signals from different locations along at least one scan in at least one dimension.

11. The method of claim 1, wherein fitting the metrology data to the mixed model containing the model for the target and the local gradient of measured signals comprises floating the parameters of interest in the model for the target and floating at least one coefficient for the local gradient of measured signals.

12. The method of claim 1, wherein the mixed model contains one or more local gradients of measured signals.

13. The method of claim 1, wherein the local gradient of measured signals is constant or is wavelength dependent.

14. The method of claim 1, wherein the metrology data for the target comprises spectral data.

15. A metrology device configured for measuring parameters of interest for a target on a sample, comprising:
   a source configured to generate radiation to be incident on the target on the sample;

at least one detector configured to detect radiation from the target produced in response to the radiation that is incident on the target; and at least one processor coupled to the at least one detector, wherein the at least one processor is configured to:
obtain metrology data for the target with the at least one detector, the metrology data is a mixture of target signals from the target and non-target signals from a non-target area;
fit the metrology data to a mixed model containing a model for the target and a local gradient of measured signals; and
determine the parameters of interest for the target based on the fit of the metrology data by the mixed model.

16. The metrology device of claim 15, wherein the radiation is incident on the device on the sample over a measurement area, and the target metrology data for the target is obtained from a location at which the measurement area includes both the target and the non-target area.

17. The metrology device of claim 16, wherein the measurement area is larger than the target in at least one dimension.

18. The metrology device of claim 15, wherein the at least one processor is further configured to:
obtain a local gradient metrology data set by acquiring a plurality of measured signals from different locations, where the measured signals from each different location is a different mixture of target signals and non-target signals; and
determine the local gradient of measured signals based on a difference in measured signals from the different locations in the local gradient metrology data set.

19. The metrology device of claim 18, wherein the local gradient metrology data set is acquired from the target.

20. The metrology device of claim 19, wherein the metrology data for the target is selected from the local gradient metrology data set.

21. The metrology device of claim 18, wherein the local gradient metrology data set is acquired from a reference target.

22. The metrology device of claim 21, wherein the reference target is on the sample with the target.

23. The metrology device of claim 21, wherein the reference target is on a different sample than the target.

24. The metrology device of claim 15, wherein the local gradient metrology data set for the target is obtained by acquiring the metrology data from different locations along at least one line scan in at least one dimension.

25. The metrology device of claim 15, wherein the at least one processor is further configured to fit the target metrology data to the mixed model containing the model for the target and the local gradient of measured signals by being configured to float the parameters of interest in the model for the target and float at least one coefficient for the local gradient of measured signals.

26. The metrology device of claim 15, wherein the mixed model contains one or more local gradients of measured signals.

27. The metrology device of claim 15, wherein the local gradient of measured signals is constant or is wavelength dependent.

28. The metrology device of claim 15, wherein the metrology data for the target comprises spectral data.

29. A method for measuring parameters of interest for a target on a sample, comprising:
obtaining mixed metrology data with a metrology device at a plurality of different locations with respect to the target, where the mixed metrology data from each different location is a mixture of target signals from the target and non-target signals from a non-target area;
determining target metrology data using a trained machine learning model based on the mixed metrology data, wherein the target metrology data comprises the target signals from the target without the non-target signals from the non-target area; and
determining the parameters of interest for the target based on the target metrology data.

* * * * *